US006303475B1

(12) United States Patent
Suvorov et al.

(10) Patent No.: US 6,303,475 B1
(45) Date of Patent: *Oct. 16, 2001

(54) METHODS OF FABRICATING SILICON CARBIDE POWER DEVICES BY CONTROLLED ANNEALING

(75) Inventors: Alexander Suvorov, Durham; John W. Palmour, Raleigh; Ranbir Singh, Cary, all of NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/451,640

(22) Filed: Nov. 30, 1999

Related U.S. Application Data

(63) Continuation of application No. 09/093,208, filed on Jun. 8, 1998, now Pat. No. 6,100,169.

(51) Int. Cl.[7] .................................................. H01L 21/336
(52) U.S. Cl. ............................ 438/519; 438/522; 438/965
(58) Field of Search .................................... 438/519, 522, 438/965, FOR 165, FOR 498, FOR 469; 148/DIG. 148

(56) References Cited

U.S. PATENT DOCUMENTS

| 3,629,011 | 12/1971 | Tohi et al. ............................ 148/1.5 |
| 5,348,895 | 9/1994 | Smayling et al. . |
| 5,384,270 | 1/1995 | Ueno ..................................... 437/40 |

(List continued on next page.)

FOREIGN PATENT DOCUMENTS

| 198 09-554 A1 | 9/1998 | (DE) . |
| WO 98/02916 | 1/1998 | (WO) . |

OTHER PUBLICATIONS

Shenoy et al., "High–Voltage Double–Implanted Power MOSFET's in 6H–SiC", IEEE Electron Device Letters, vol., 18, No. 3, Mar. 1997, pp. 93–95.

International Search Report, PCT/US 99/12713, Jan. 12, 2000.

Palmour et al., SiC Device Technology: Remaining Issues, Diamond and Related Materials, vol. 6, No. 10, 1997, pp. 1400–1404.

Rao et al., Al and N Ion Implantations in 6H–SiC, Institute of Physics Conference Series, GB, IOP Publishing, pp. 521–524 no date.

(List continued on next page.)

Primary Examiner—George Fourson
Assistant Examiner—Joannie Adelle Garcia
(74) Attorney, Agent, or Firm—Myers Bigel Sibley & Sajovec

(57) ABSTRACT

Silicon carbide power devices are fabricated by masking the surface of a silicon carbide substrate to define an opening at the substrate, implanting p-type dopants into the silicon carbide substrate through the opening at implant energy and dosage that form a deep p-type implant, and implanting n-type dopants into the silicon carbide substrate through the opening at implant energy and dosage that form a shallow n-type implant relative to the deep p-type implant. The deep p-type implant and the shallow n-type implant are annealed at less than 1650° C., but preferably more than about 1500°. The annealing preferably takes place for between about five minutes and about thirty minutes. Ramp-up time from room temperature to the anneal temperature is also controlled to be less than about one hundred minutes but more than about thirty minutes. Ramp-down time after annealing is also controlled by decreasing the temperature from the annealing temperature to below about 1500° C. in less than about two minutes. By controlling the ramp-up time, the annealing time and/or temperature and/or the ramp-down time, high performance silicon carbide power devices may be fabricated.

27 Claims, 14 Drawing Sheets

U.S. PATENT DOCUMENTS

| | | | |
|---|---|---|---|
| 5,459,089 | 10/1995 | Baliga | 437/40 |
| 5,510,281 | 4/1996 | Ghezzo et al. | 437/41 |
| 5,710,059 | 1/1998 | Rottner | 437/151 |
| 5,712,502 | 1/1998 | Mitlehner et al. | 257/341 |
| 5,804,483 | 9/1998 | Harris | 438/268 |
| 5,837,572 | 11/1998 | Gardner et al. | 438/199 |
| 5,849,620 | 12/1998 | Harris et al. | 438/273 |
| 5,851,908 | 12/1998 | Harris et al. | 438/520 |
| 5,877,041 | 3/1999 | Fuller | 438/105 |

OTHER PUBLICATIONS

Rao et al., P–N Junction Formation in 6H–SiC by Acceptor Implantation Into N–Type Substrate, Nuclear Instruments and Methods in Physics Research B, vol. 6, No. 1, 1995, pp. 333–338.

International Search Report, PCT/US99/12714, Sep. 29, 1999.

Shenoy et al., "High–Voltage Double–Implanted Power MOSFET's in 6H–SiC", IEEE Electron Device Letters, vol., 18, No. 3, Mar. 1997, pp. 93–95.

ID: 6,303,475 B1

METHODS OF FABRICATING SILICON CARBIDE POWER DEVICES BY CONTROLLED ANNEALING

CROSS-REFERENCE TO RELATED APPLICATION

This application is a con of concurrently filed U.S. application Ser. No. 09/093,208 to the present inventors, now U.S. Pat. No. 6,100,169, entitled "Self-Aligned Methods of Fabricating Silicon Carbide Power Devices by Implantation and Lateral Diffision", the disclosure of which is incorporated herein by reference.

FEDERALLY SPONSORED RESEARCH

This invention was made with Government support under Ballistic Missile Defense Organization Contract No. F33615-94-C-2500 and Office of naval Research Contract No. N00014-95-1-1302.

FIELD OF THE INVENTION

This invention relates to methods of fabricating power devices, and more particularly to methods of fabricating silicon carbide power devices.

BACKGROUND OF THE INVENTION

Power devices are widely used to carry large currents and support high voltages. Modem power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n+ source. The difference in the lateral diffusion between the p-base and n+ source regions forms a surface channel region. An overview of power MOSFETs including DMOSFETs may be found in the textbook entitled *"Power Semiconductor Devices"* by B. J. Baliga, published by PWS Publishing Company, 1996, and specifically in Chapter 7, entitled "Power MOSFET", the disclosure of which is hereby incorporated herein by reference.

Recent development efforts in power devices have also included investigation of the use of silicon carbide (SiC) devices for power devices. Silicon carbide has a wide bandgap, a high melting point, a low dielectric constant, a high breakdown field strength, a high thermal conductivity, and a high saturation electron drift velocity compared to silicon. These characteristics may allow silicon carbide power devices to operate at higher temperatures, higher power levels and with lower specific on-resistance than conventional silicon-based power devices. A theoretical analysis of the superiority of silicon carbide devices over silicon devices is found in a publication by Bhatnagar et al. entitled "Comparison of 6H-SiC, 3C-SiC and Si for Power Devices", IEEE Transactions on Electron Devices, Vol. 40, 1993, pp. 645–655. A power MOSFET fabricated in silicon carbide is described in U.S. Pat. No. 5,506,421 to Palmour entitled "Power MOSFET in Silicon Carbide" and assigned to the assignee of the present invention.

Notwithstanding these potential advantages, it may be difficult to fabricate power devices including power MOSFETs in silicon carbide. For example, as described above, the double-diffused MOSFET (DMOSFET) is generally fabricated in silicon using a double diffusion process wherein the p-base region is driven in deeper than the n+ source. Unfortunately, in silicon carbide, the diffusion coefficients of conventional p- and n-type dopants are small compared to silicon, so that it may be difficult to obtain the required depths of the p-base and n+ source regions using acceptable diffusion times and temperatures. Ion implantation may also be used to implant the p-base and the n+ source. See, for example, "High-Voltage Double-Implanted Power MOSFET's in 6H-SiC" by Shenoy et al., IEEE Electron Device Letters, Vol. 18, No. 3, March 1997, pp. 93–95. However, it may be difficult to control the depth and lateral extent of ion implanted regions. Moreover, the need to form a surface channel surrounding the source region may require the use of two separate implantation masks. It may then be difficult to align the p-base and the source regions to one another, thereby potentially impacting the device performance.

Published PCT International Application WO 98/02916, published Jan. 22, 1998, describes a method for producing a doped p-type channel region layer having on laterally opposite sides thereof doped n-type regions in a silicon carbide layer for producing a voltage-controlled semiconductor device. A masking layer is applied on top of a silicon carbide layer that is lightly n-doped. An aperture is etched in the masking layer extending to the silicon carbide layer. N-type dopants are implanted into an area of the silicon carbide layer defined by the aperture for obtaining a high doping concentration of n-type in the surface-near layer of the silicon carbide layer under the area. P-type dopants having a considerably higher diffusion rate in silicon carbide than the n-type dopants, are implanted into an area of the silicon carbide layer defined by the aperture to such a degree that the doping type of the surface-near layer is maintained. The silicon carbide layer is then heated at such a temperature that the p-type dopants implanted in the surface-near layer diffuse into the surrounding regions of the silicon carbide layer that is lightly n-doped, to such a degree that a channel region layer in which p-type dopants dominates is created laterally to the highly doped n-type surface-near layer and between this layer and lightly n-doped regions of the silicon carbide layer. As described in this International Application, the heating is carried out a temperature above 1650° C. and below 1800°.

SUMMARY OF THE INVENTION

The present invention provides methods of fabricating silicon carbide power devices by masking the surface of a silicon carbide substrate to define an opening at the substrate, implanting p-type dopants into the silicon carbide substrate through the opening at implant energy and dosage that form a deep p-type implant, and implanting n-type dopants into the silicon carbide substrate through the opening at implant energy and dosage that form a shallow n-type implant relative to the deep p-type implant. According to the invention, the deep p-type implant and the shallow n-type implant are annealed at less than 1650° C., but preferably more than about 1500°. The annealing preferably takes place for between about five minutes and about thirty minutes. It has been found that by annealing at more than about 1500° C. but less than 1650° C., the deep p-type implant laterally diffuses to the surface of the silicon carbide substrate surrounding the shallow n-type implant, without vertically diffusing the deep p-type implant to the surface of the silicon carbide substrate through the shallow n-type implant.

According to another aspect of the present invention, ramp-up time from room temperature to the anneal temperature is also controlled. Specifically, prior to annealing, the temperature of the silicon carbide substrate is increased from below about 500° C. to about 1400° C. in less than about sixty minutes but more than about twenty minutes. More specifically, the temperature of the silicon carbide substrate is increased from room temperature to the annealing temperature of less than 1650° C. in less than one hundred minutes, but more than thirty minutes. Thus, the temperature of the silicon carbide substrate is increased sufficiently rapidly to prevent annealing of defects in the silicon carbide substrate, which could prevent lateral diffusion of the deep p-type implant to the surface of the silicon carbide substrate surrounding the shallow n-type implant, without vertically diffusing the deep p-type implant to the surface of the silicon carbide substrate through the shallow n-type implant.

According to another aspect of the present invention, it has been found that the ramp-down time after annealing is also preferably controlled in order to preserve the diffused p-type implant. In particular, the temperature of the silicon carbide substrate is rapidly decreased to below about 1500° C. after annealing. More specifically, the temperature of the silicon carbide is decreased from the annealing temperature to below about 1500° C. in less than about two minutes. Accordingly, by controlling the ramp-up time, the annealing time and/or temperature and/or the ramp-down time, high performance silicon carbide power devices may be fabricated.

It will be understood that the step of implanting p-type dopants may be performed prior to the step of implanting n-type dopants. Alternatively, the n-type dopants may be implanted first, and then electrically activated, for example, by annealing. The p-type dopants may then be implanted. It will also be understood that n-type dopants for silicon carbide typically comprise nitrogen, and that p-type dopants for silicon carbide may comprise boron or beryllium. Beryllium is presently preferred for the deep p-type implants of the present invention, because beryllium may be implanted deeply while still creating an abrupt junction with the silicon carbide substrate.

According to another aspect of the present invention, an aluminum well optionally is implanted at the surface of the silicon carbide substrate, electrically contacting the laterally diffused p-type implant. The aluminum well may extend through the shallow n-type implant to electrically contact the laterally diffused p-type implant. Alternatively, the aluminum well may be formed outside of and electrically contacting the laterally diffused p-type implant. It will be understood that the aluminum well may be implanted after the shallow and deep implants are implanted or prior to implanting the shallow and deep implants.

Lateral MOSFETs may be fabricated according to the present invention by also implanting n-type dopants into the surface of the silicon carbide substrate in spaced apart relation from the laterally diffused p-type implant to define a drain region. A gate insulating region is formed on the surface of the silicon carbide substrate, that contacts the laterally diffused p-type implant at the surface of the silicon carbide substrate. A source contact, a drain contact and a gate contact are formed on the shallow n-type implant and on the aluminum well, on the drain region, and on the gate insulating region, respectively.

Vertical MOSFETs may be formed according to the invention by forming a gate insulating region on the surface of the silicon carbide substrate, that contacts the laterally diffused p-type implant at the surface of the silicon carbide substrate. A source contact, a drain contact and a gate contact are formed on the shallow n-type implant and on the aluminum well, on a second surface of the silicon carbide substrate that is opposite the source contact, and on the gate insulating region, respectively. Accordingly, by controlling the ramp-up time, the annealing time and/or temperature and/or the ramp-down time, high performance silicon carbide power devices may be fabricated.

DETAILED DESCRIPTION OF PREFERRED EMBODIMENTS

Figure 1A:
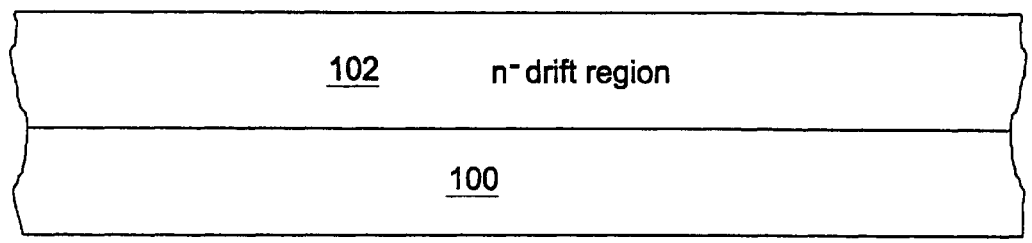
FIGS. 1A–1G are cross-sectional views of methods of fabricating silicon carbide lateral power MOSFETs according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Referring now to FIGS. 1A–1G, methods of fabricating a pair of lateral power MOSFETs according to the present invention will now be described. Since the lateral power MOSFETs employ self-aligned implantation and diffusion, the silicon carbide lateral power MOSFETs are also referred to as Lateral Implanted Diffused MOSFETs or LIDMOSFETs.

Referring now to FIG. 1A, a substrate such as a semi-insulating substrate 100 is provided with an n– drift region 102 thereon. It will be understood by those having skill in the art that substrate 100 may comprise doped or undoped silicon carbide or any other material that is lattice-matched to silicon carbide, including but not limited to gallium nitride. Substrate 100 is preferably semi-insulating, to prevent vertical conduction between adjacent devices through the substrate 100.

N– drift region 102 may be formed by epitaxial deposition, implantation or other conventional techniques. It will be understood that the combination of the substrate 100 and n– drift region 102 may also be referred to collectively as a substrate. N– drift region 102 may have carrier concentrations of from about $10^{12}$ cm$^{-3}$ to about $10^{17}$ cm$^{-3}$, and may have a thickness of from about 3 µm to about 500 µm. The substrate 100 may have a thickness of from about 100 µm to about 500 µm. The fabrication of substrate 100 and n– drift region 102 is well known to those having skill in the art and need not be described further herein.

Figure 1B:
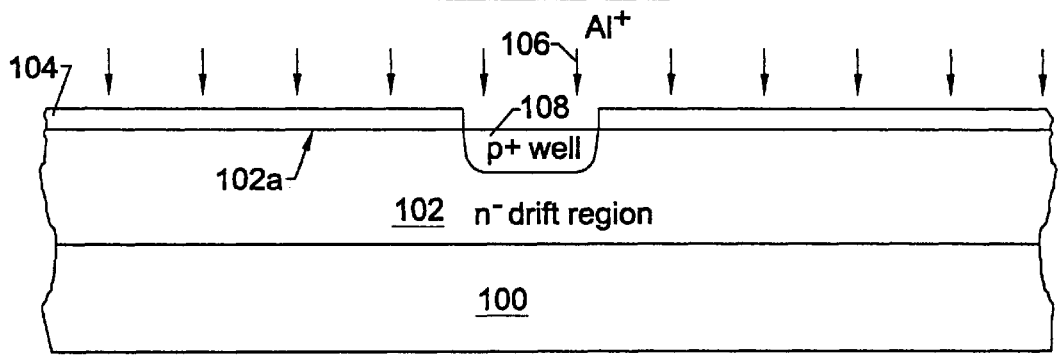

Referring now to FIG. 1B, a first mask 104 is patterned on the surface 102a of n– drift region 102. The first mask 104 may be formed of silicon dioxide or other conventional masking materials. As shown in FIG. 1B, the first mask 104 defines an opening that exposes a portion of the surface 102a of the n– drift region 102. As also shown in FIG. 1B, p-type ions, preferably aluminum ions 106, optionally are implanted into the drift region 102 through the surface 102a, to thereby form an optional p+ well 108 in drift region 102. As will be described later, p+ well 108 can improve the ohmic contact to a p-type diffused region. First mask 104 is then removed.

Figure 1C:
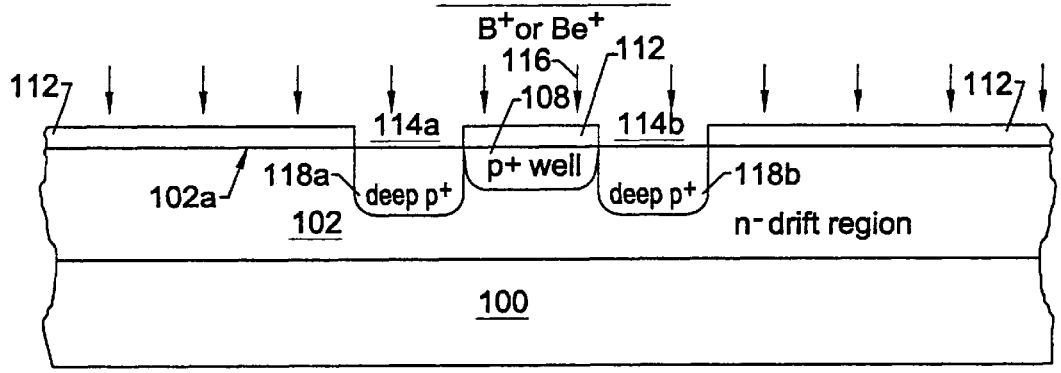

Referring now to FIG. 1C, a second mask 112, formed of silicon dioxide or other conventional masking materials, is patterned on n– drift region 102, to define a first pair of openings 114a and 114b on the drift region, a respective one of which is on a respective opposite side of the p+ well 108. Then, p-type dopants such as boron or beryllium ions 116 are implanted into the n– drift region 102 through the first pair of openings 114a and 114b, to form a pair of deep p+ implants 118a, 118b on the opposite sides of the p+ well 108. As will be described below, beryllium is preferred for the deep p+ implants, because beryllium can form abrupt junctions with the drift region 102. It will also be understood that the deep p+ implants 118a and 118b may be formed using a single implantation and dosage, for example by implanting boron ions at 180 keV energy and 4×10$^{15}$ cm$^{-2}$ dosage, to provide a carrier concentration of about 10$^{16}$ cm$^{-3}$. Beryllium also can be implanted at 40 keV energy and 3.2×10$^{15}$ cm$^{-2}$ dosage. Alternatively, multiple dosages and/or energies may be used.

Figure 1D:
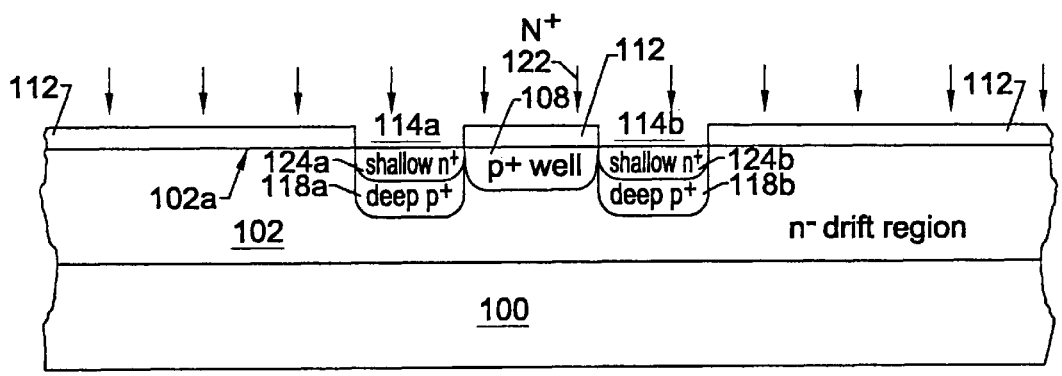

Referring now to FIG. 1D, the second mask 112 is not removed and n-type ions 122 such as nitrogen are implanted through the first and second openings 114a and 114b, to form a pair of shallow n+ implants 124a, 124b. Single or multiple implants may be used, as described below. Carrier concentrations greater than about 10$^{18}$ cm$^{-3}$ may be provided. It will be understood that since the same second mask 112 is used for the deep p+ implants of FIG. 1C and the shallow n+ implants of FIG. 1D, these implants may be self-aligned to one another.

Figure 1E:
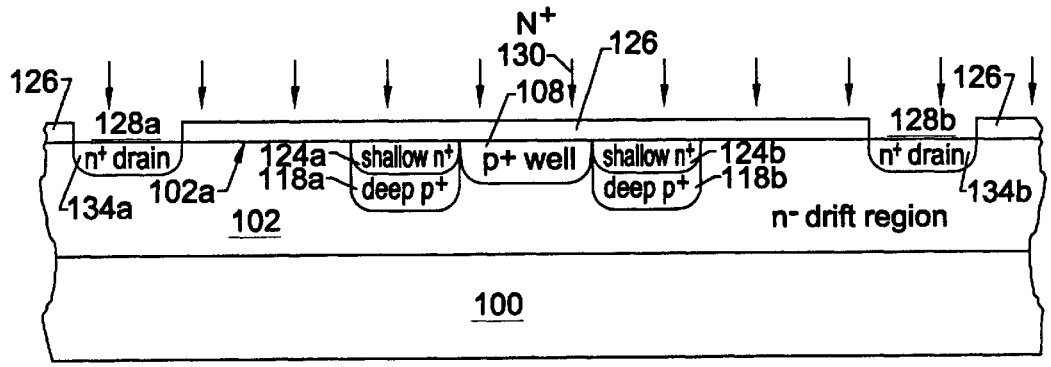

Referring now to FIG. 1E, the second mask 112 is removed and a third mask 126 is formed. As shown in FIG. 1E, the third mask 126, which may be formed of silicon dioxide or other conventional masking materials, defines a second pair of openings 128a and 128b on the surface 102a of the drift region 102. The second pair of openings 128a, 128b are spaced apart from the respective shallow n-type implants 124a, 124b and are opposite the p+ well 108.

Still referring to FIG. 1E, p-type dopants 130 such as nitrogen are implanted into the n– drift region 102 through the second pair of openings 128a, 128b, to form a pair of n+ drain regions 134a, 134b. The third mask 126 may then be removed.

It will be understood by those having skill in the art that the order of steps in FIGS. 1B, 1C, 1D and 1E may be changed. Thus, for example, the p+ well 108 of FIG. 1B may be formed after forming the deep p+ implants 118a, 118b of FIG. 1C, and may also be formed after forming the shallow n+ implants 124a, 124b of FIG. 1D. The p+ well of FIG. 1B may also be formed after forming the n+ drain regions 134a, 134b of FIG. 1E. Moreover, the deep p+ implants 118a, 118b of FIG. 1C may be formed after forming the shallow n+ implants 124a, 124b of FIG. 1D. If this is the case, an anneal is preferably performed after implanting the shallow n+ implants 124a, 124b, at temperature and time that can be tolerated by the mask and that is sufficient to electrically activate the n-type dopants.

The n+ drain regions 134a, 134b of FIG. 1E also may be formed prior to forming the shallow n+ implants 124a, 124b of FIG. 1D, the deep p+ implants 118a, 118b of FIG. 1C and/or the p+ well 108 of FIG. 1B. The n+ drain regions 134a, 134b may also be implanted simultaneously with the shallow n+ regions 124a, 124b of FIG. 1D. If the n+ drain regions 134a, 134b are implanted simultaneously with the shallow n+ implants 124a, 124b, the second pair of openings 128a, 128b may be formed in second mask 112, to allow the simultaneous implant.

Figure 1F:
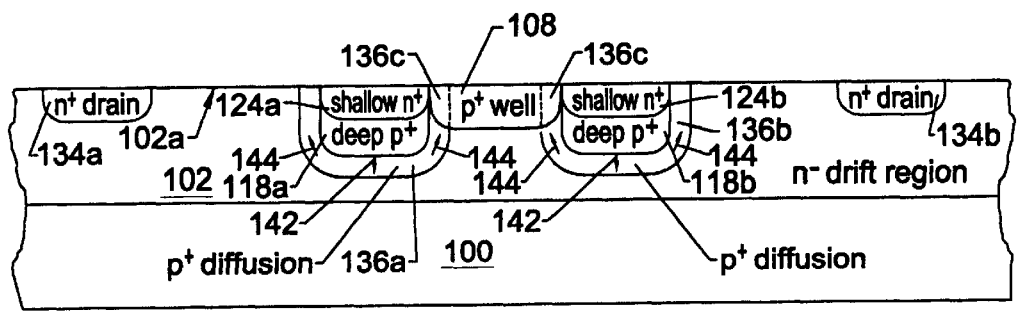

Referring now to FIG. 1F, an anneal is performed at temperature and time that is sufficient to laterally diffuse the deep p-type implants 118a, 118b, to the surface 102a of the silicon carbide substrate surrounding the respective shallow n-type implants 124a, 124b, without vertically diffusing the respective deep p-type implants to the surface of the silicon carbide substrate through the respective shallow n-type implants 124a, 124b. For example, vertical diffusion of the deep p-type implants into the shallow n-type implants 124a, 124b, to less than 0.5% of the thickness of the shallow n-type implants 124a, 124b preferably takes place. Annealing may take place, for example, at 1600° C. for five minutes, to diffuse the deep p-type implants about 1 µm. However, other annealing times and temperatures may be used. For example, annealing times between about 1500° C. and about 1600° C. and times between about 1 minute and 30 minutes may be used to diffuse boron from the deep p-type implants to distances of between about 0.5 µm and 3 µm in the vertical and lateral directions.

Accordingly, a pair of p+ diffusion regions 136a, 136b are formed by diffusing p+ dopants from the deep p+ implants 118a, 118b vertically away from surface 102a as shown by arrows 142, and laterally and vertically towards the surface 102a as shown by arrows 144. As also shown by arrows 144, the lateral diffusion diffuses around the shallow n+ implants 124a, 124b to the surface 102a of the drift region opposite the p+ well 108. As shown by the regions 136c, lateral diffusion into p+ well 108 may also take place, to further improve the ohmic contact.

Figure 1G:
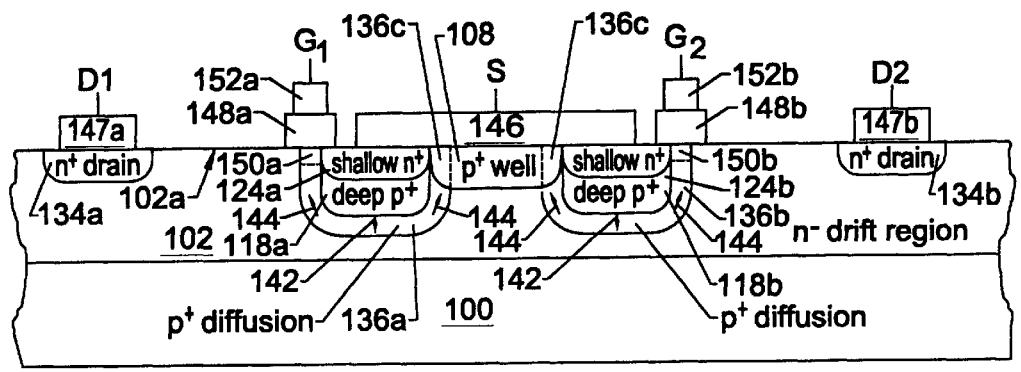

Finally, referring to FIG. 1G, an insulated gate and source and drain contacts are formed. For example, a source contact 146 and a pair of spaced apart drain contacts 147a, 147b may be formed by blanket depositing nickel and then patterning the blanket deposited nickel. The source contact 146 is labeled S in FIG. 1G and the drain contacts 147a, 147b are labeled D1 and D2 in FIG. 1G. As shown in FIG. 1G, the source contact provides a common source contact that extends on the shallow n+ implants 124a, 124b and on the p+ well 108. The drain contacts 147a, 147b electrically contact the n+ drains 134a, 134b respectively.

Continuing with the description of FIG. 1G, a pair of gate insulating regions 148a, 148b, for example silicon dioxide, are formed on the surface 102a of n− drift region 102, a respective one of which contacts a respective portion of the p+ diffusion region 136a, 136b that has laterally diffused to the surface of the n− drift region 102, opposite the p+ well 108. Thus, these regions form a pair of channel regions 150a, 150b in the laterally diffused p-type implants at the surface of the silicon carbide substrate. Self-aligned channel regions, that are aligned to the source regions, are thereby formed. A pair of gate contacts 152a, 152b is then formed on the respective pair of gate insulating regions 148a, 148b. The gate contacts are labeled G1 and G2 in FIG. 1G and may comprise nickel.

It will also be understood that the formation of insulating regions and contacts described in FIG. 1G may be performed in different sequences from that described. For example, the gate contacts 152a, 152b may be formed simultaneously with the source contact 146 and the drain contacts 147a, 147b. Preferably, the gate contacts 152a, 152b are formed prior to forming the source contact 146 and the drain contacts 147a, 147b.

Figure 2:
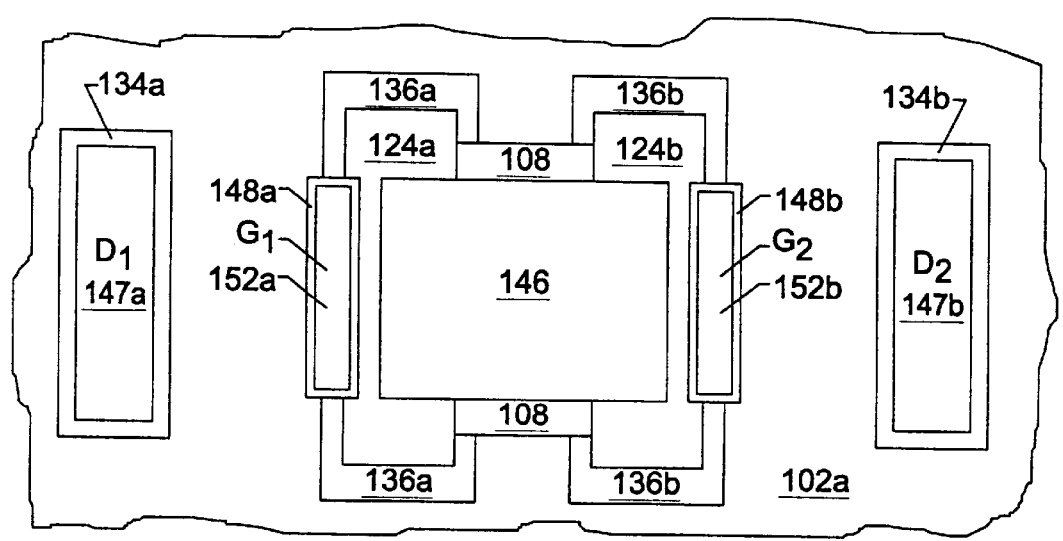
FIG. 2 is a top view of FIG. 1G.

FIG. 2 is a top view of the completed device of FIG. 1G. As shown, a pair of common source LIDMOSFETs are formed. It will be understood that the pair of common source LIDMOSFETs may be replicated on a silicon carbide substrate to form an array of unit cells. Moreover, the left half or right half of FIGS. 1A–1G may also be replicated if unit cells that do not include common sources are desired.

Referring now to FIGS. 3A–3G, methods of forming silicon carbide vertical power MOSFETs according to the present invention will now be described. Since these vertical power MOSFETs are fabricated using implantation and diffusion, they are also referred to herein as a silicon carbide Vertical Implanted Diffused MOSFETs (VIDMOSFETs).

Figure 3A:
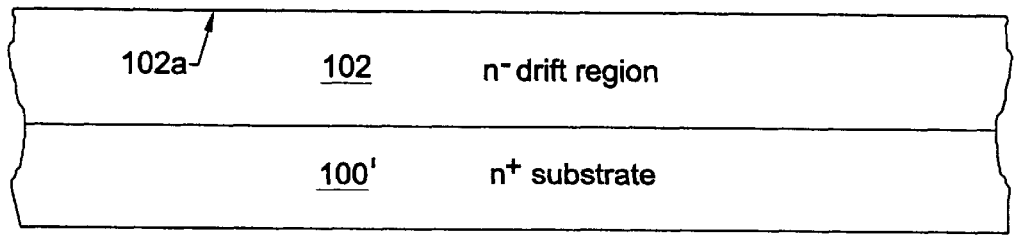
FIGS. 3A–3G are cross-sectional views of methods of fabricating silicon carbide vertical power MOSFETs according to the present invention.

Referring now to FIG. 3A, a silicon carbide substrate 100' including an n− drift region 102 is provided. Since FIGS. 3A–3G illustrate fabrication of a vertical MOSFET that includes conduction through the substrate, substrate 100' is preferably an n+ conductive silicon carbide substrate that is fabricated using known techniques. The n+ conductive silicon carbide substrate may have a carrier concentration of between about $10^{16}$ cm$^{-3}$ and about $10^{19}$ cm$^{-3}$. N− drift region 102 may also be fabricated as was described in connection with FIG. 1A. It will also be understood that the combination of n+ substrate 100' and n− drift region 102 may also be referred to as a substrate, as was already described.

Figure 3B:
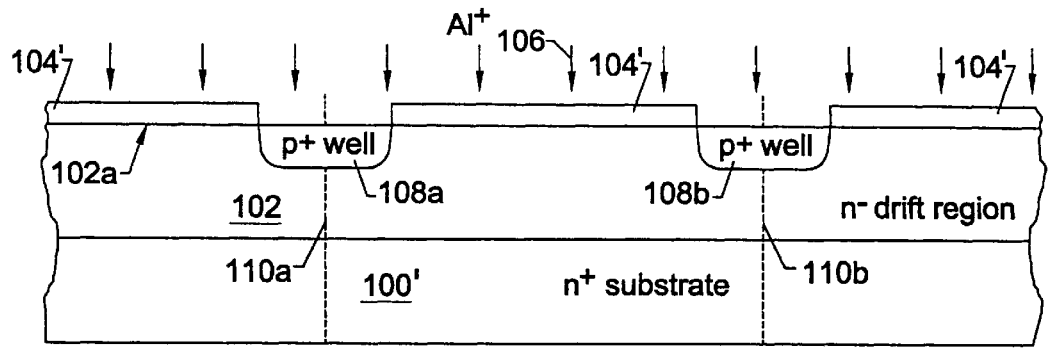

Referring now to FIG. 3B, a pair of spaced apart p+ wells 108a, 108b are implanted into the drift region 102 at the surface 102a of the silicon carbide substrate. A pair of spaced apart p+ wells 108a, 108b are implanted into surface 102a of drift region 102 using first mask 104', that includes a pair of openings therein, in a manner described in connection with FIG. 1D. As was also described, the p+ well is preferably formed by implanting aluminum ions 106.

It will be understood by those having skill in the art that the vertical silicon carbide MOSFETs are generally replicated in a unit cell. Accordingly, the unit cell between lines 110a and 110b will be described and labeled in FIGS. 3B–3G and 4. For ease of illustration, the replicated unit cells outside lines 110a and 110b will not be labeled.

Figure 3C:
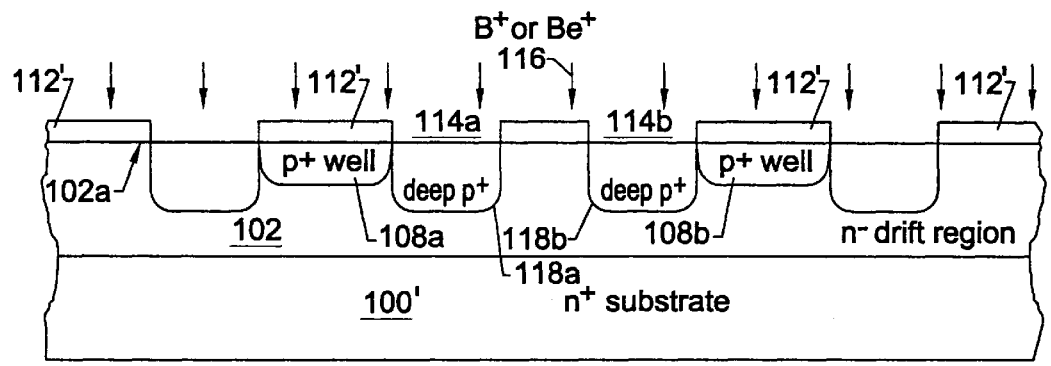

Referring now to FIG. 3C, a pair of openings 114a, 114b are formed as was described in connection with FIG. 1C, except a modified second mask 112' is used to form these openings between the pair of aluminum wells 108a, 108b. Boron, and more preferably beryllium, ions 116 are then implanted to form deep p+ implants 118a, 118b as was described in connection with FIG. 1C.

Figure 3D:
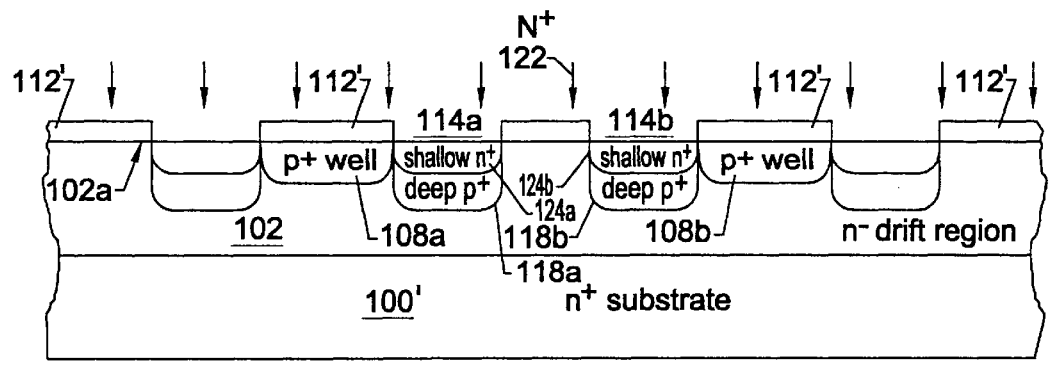

Referring now to FIG. 3D, using the same second mask 112', shallow n+ implants 124a, 124b are implanted using for example nitrogen ions 122, as was already described in connection with FIG. 1D.

Figure 3E:
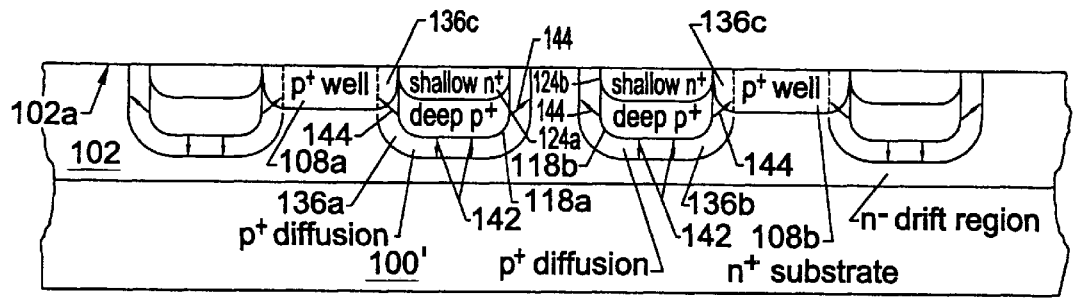

Referring now to FIG. 3E, an anneal is performed in a manner that was already described in connection with FIG. 1F. It will be understood that since FIGS. 3A–3G illustrate fabrication of a vertical MOSFET, the fabrication of a pair of n+ drains 134a, 134b as shown in FIG. 1E, may be omitted. It will also be understood that the order of fabricating the p+ wells 108a, 108b, the deep p+ implants 118a, 118b and the shallow n+ implants 124a, 124b may be changed, as was already described in connection with FIGS. 1B–1F.

Figure 3F:
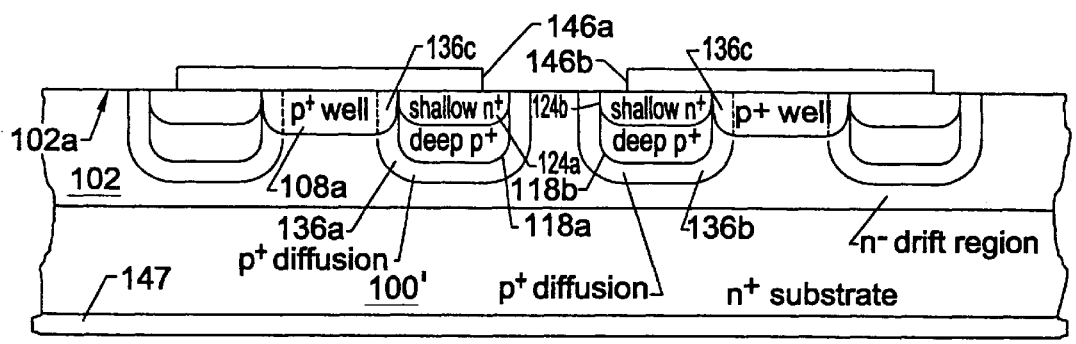

Referring now to FIG. 3F, a pair of source contacts 146a, 146b, for example comprising nickel, are formed on the shallow n-type implants 124a, 124b and extending on the p-well 108a, 108b adjacent thereto, as was described in connection with FIG. 1G. A drain contact 147 is formed on a face of the silicon carbide substrate 100 that is opposite n− drift region 102. Drain contact 147 also preferably comprises nickel.

Figure 3G:
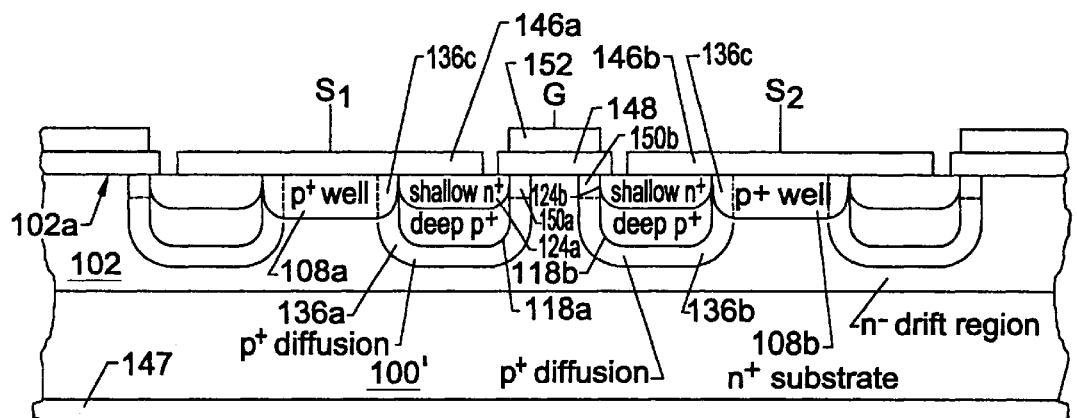

Finally, as shown in FIG. 3G, a gate insulating region 148 is formed at the surface 102a of the drift region 102, extending between and on the deep p-type implants 136a, 136b that have diffused to the surface of the silicon carbide substrate, surrounding the respective shallow n-type implants. Accordingly, these regions form a pair of channel regions 150a, 150b in the laterally diffused p-type implants at the surface 102a of the silicon carbide substrate between the shallow n-type implants. A gate contact 152, for example comprising nickel, is formed on the gate insulating region 148. As was described in connection with FIG. 1G, the order of forming the gate insulating region 148 and the source, drain and gate contacts may be varied.

Figure 4:
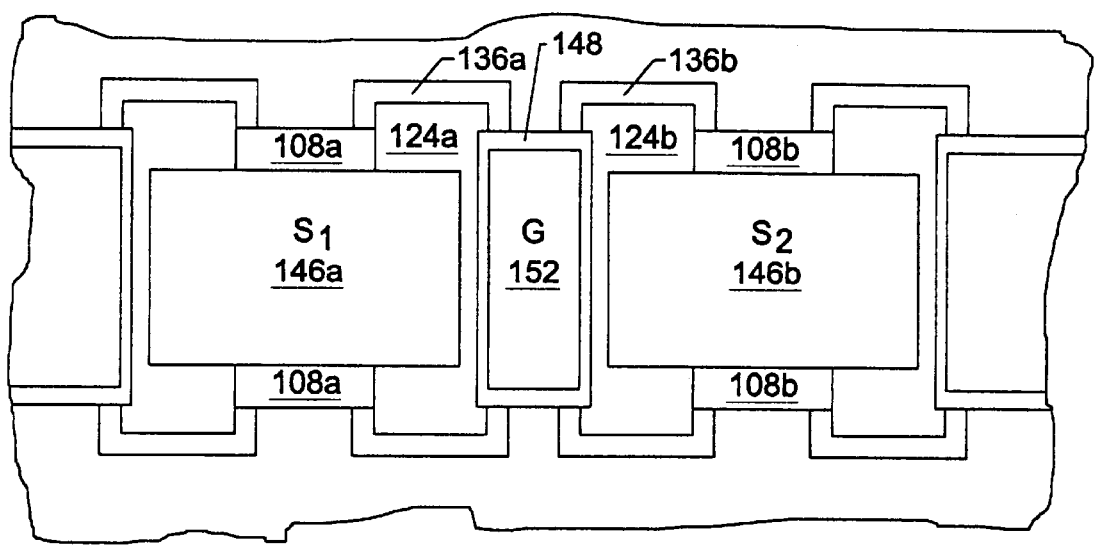
FIG. 4 is a top view of FIG. 3G.

FIG. 4 is a top view of the completed structure. The drain contact on the bottom surface is not shown.

Additional considerations in the fabrication of silicon carbide power devices according to the present invention will now be described.

The p+ well 108 of FIGS. 1B–1G and 108a, 108b of FIGS. 3B–3G may be formed by room temperature or high temperature implantation using a first implant of aluminum at 25 keV energy and $2\times10^{15}$ cm$^{-2}$ dose and a second implant of aluminum at 90 keV energy and $4\times10^{15}$ cm$^{-2}$ dose, to produce an aluminum well having 0.1 μm depth with a carrier concentration of $5\times10^{20}$ cm$^{-3}$. The deep p+ regions 118a, 118b of FIGS. 1C–1G and 3C–3G may be fabricated by implanting boron at room temperature at a first energy of 450 keV and dose of $3.2\times10^{14}$ cm$^{-2}$ and a second energy of 370 keV and dose of $1.5\times10^{14}$ cm$^{-2}$, to produce an activated dopant concentration $N_A$ of $2\times10^{18}$ cm$^{-3}$ at a depth from 0.4 µm to 1.0 µm. An activated dopant concentration $N_A$ of $2\times10^{18}$ cm$^{-3}$ at the surface of the silicon carbide substrate, surrounding the shallow n-type implants is also produced. Finally, the shallow n+ implants 124a, 124b of FIGS. 1D–1G and FIGS. 3D–3G may be fabricated using four implants of nitrogen at room temperature. The first implant is made at an energy of 25 keV and a dose of $3\times10^{14}$ cm$^{-2}$. The second, third and fourth implants are made at energies of 60 keV, 120 keV and 200 keV respectively and $6\times10^{14}$ cm$^{-2}$, $8\times10^{14}$ cm$^{-2}$ and $1\times10^{15}$ cm$^{-2}$ respectively, to produce a shallow n+ region having carrier concentration of $1\times10^{20}$ cm$^{-3}$ at a depth from 0 to 0.4 µm. After annealing at 1600° C. for five minutes, channel regions 150a, 150b of FIGS. 1G and 3G may be produced having a width of 0.3 µm at the substrate surface 102a. The depth of the p+ diffusions 136a, 136b may extend 1.5 µm from the substrate surface 102a.

Figure 5:
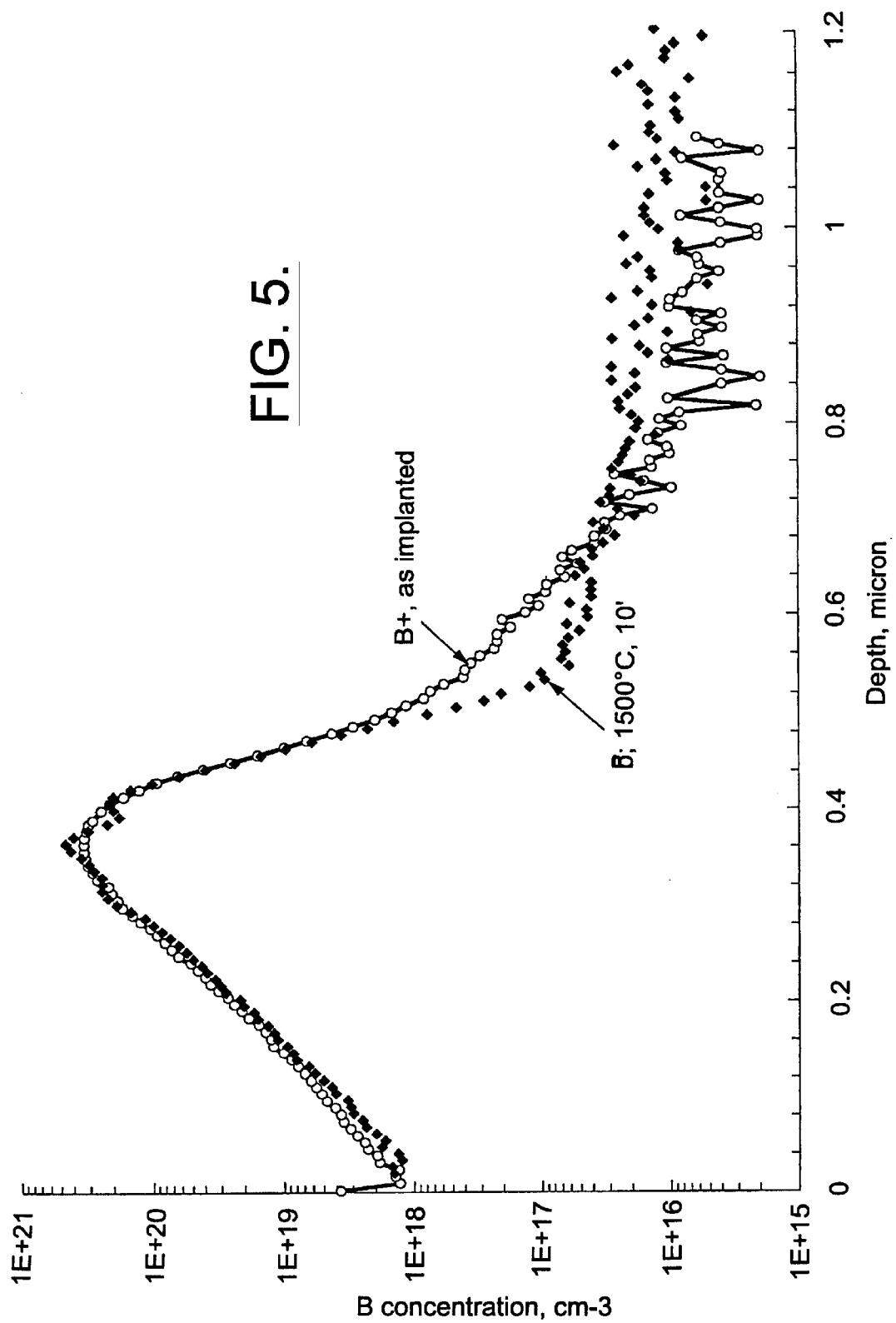
FIG. 5 graphically illustrates boron diffusion during annealing.
Figure 6:
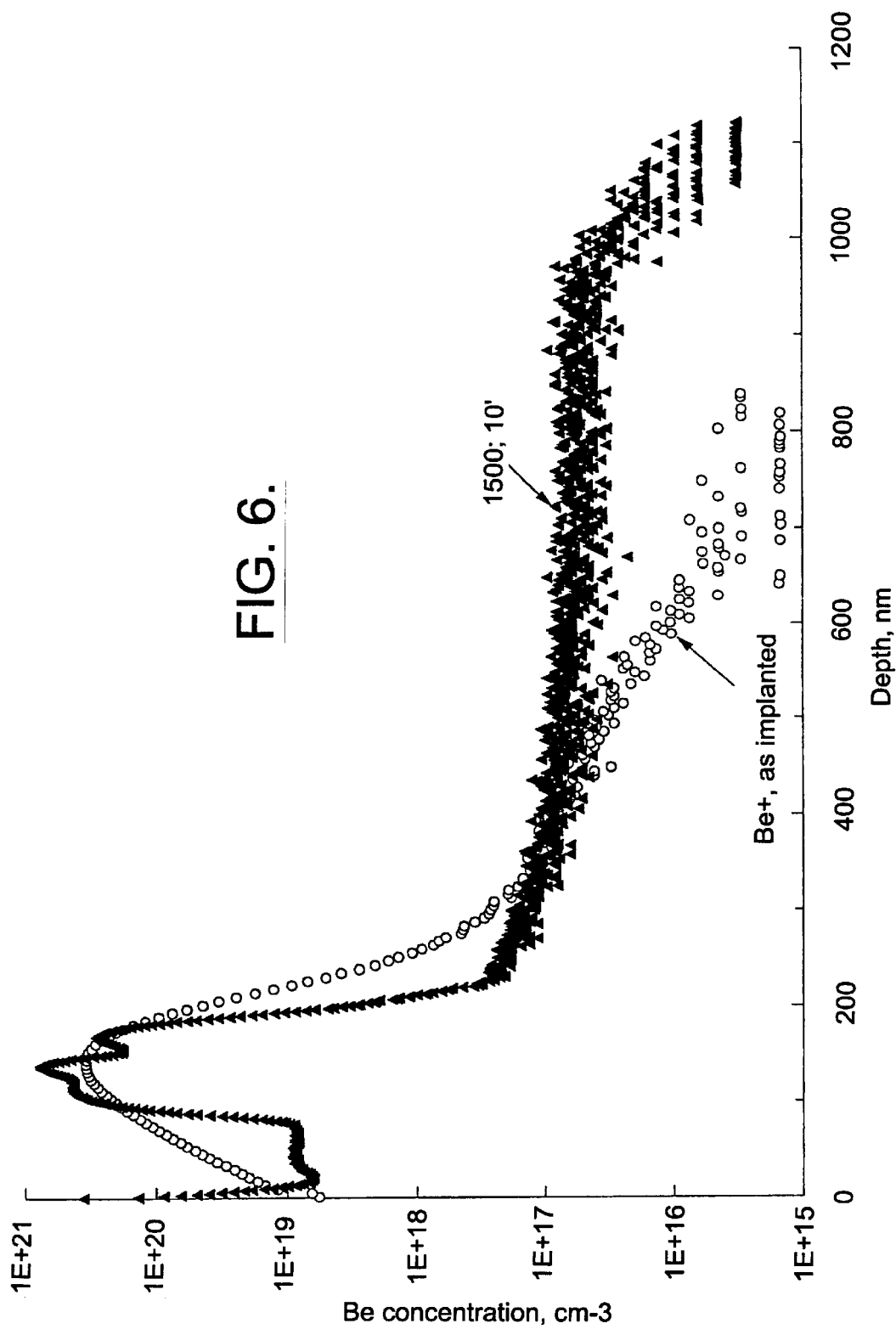
FIGS. 6 and 7 graphically illustrate beryllium diffusion during annealing.

As was described above, beryllium is preferred for the deep p+ implants, because beryllium can form abrupt junctions with the drift region 102. FIGS. 5 and 6 compare diffusion of boron and beryllium respectively after annealing.

More specifically, FIG. 5 illustrates boron concentration versus depth for boron as implanted into 4H-SiC at room temperature at energy of 180 keV and dosage of $4\times10^{15}$ cm$^{-2}$, to provide a boron carrier concentration of $2.3\times10^{15}$ cm$^{-3}$. Annealing is performed at 1500° C. for ten minutes. As shown in FIG. 5, after annealing, the as-implanted boron diffuses and only gradually falls off.

In contrast, as shown in FIG. 6, beryllium is implanted in a 4H-SiC substrate at energy of 40 keV and dosage $3.2\times10^{15}$ cm$^{-2}$ at room temperature, to provide a beryllium concentration of $1\times10^{19}$ cm$^{-3}$. As shown in FIG. 6, after annealing at 1500° C. for ten minutes, the as-implanted beryllium diffuses at a relatively constant carrier concentration with a rapid falloff at about 1000 nm. Accordingly, a deeper, more uniform diffusion may take place with beryllium, with an abrupt junction being formed with the drift region compared to boron.

Figure 7:
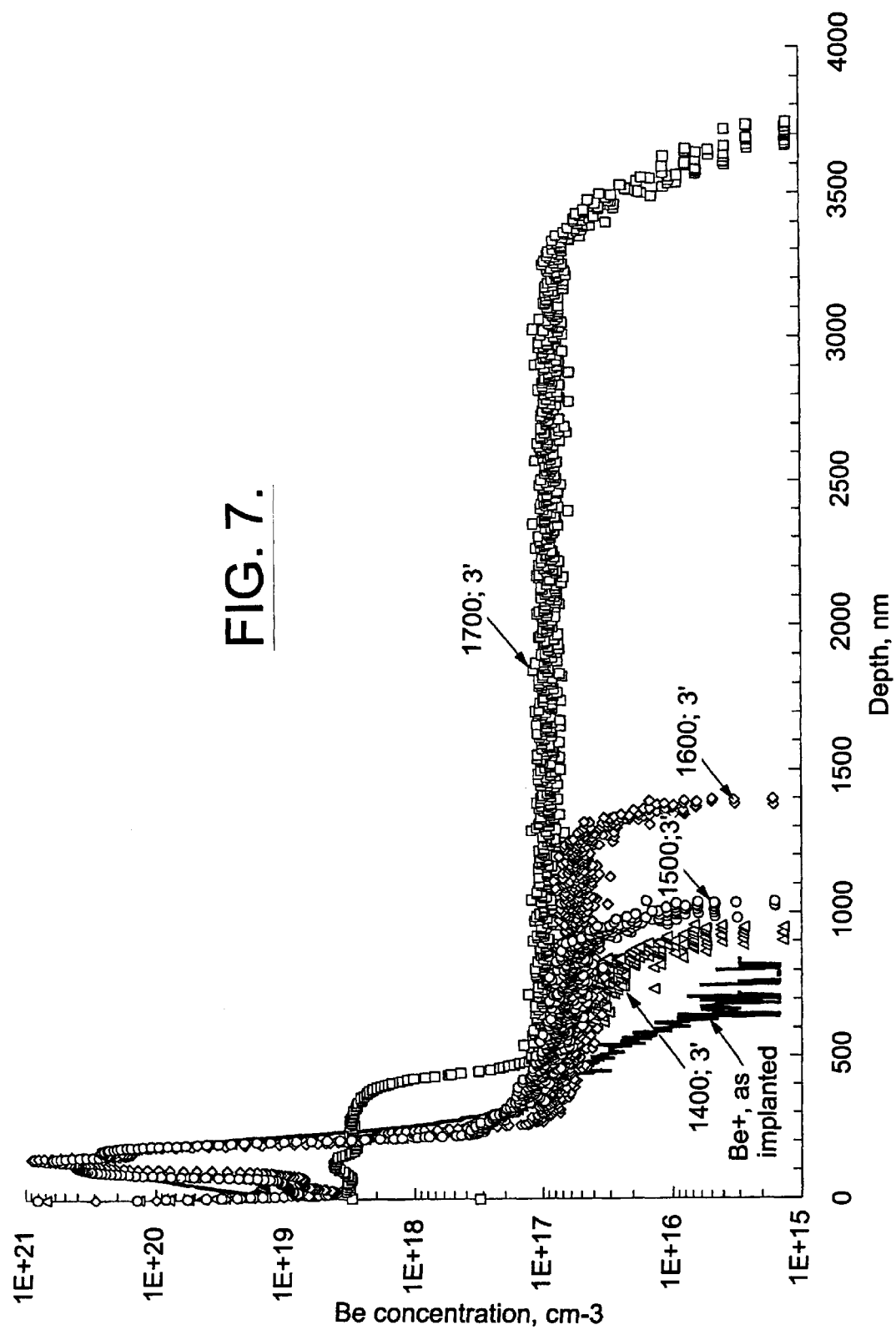

FIG. 7 further illustrates diffusion of implanted beryllium during annealing. The beryllium is implanted under the conditions described for FIG. 6. As shown in FIG. 7, as the annealing temperature increases from 1400° C. to 1700° C. at a constant annealing time of three minutes, the diffusion depth continues to increase while remaining uniform and exhibiting an abrupt falloff. Accordingly, beryllium may be preferred over boron.

Figure 8:
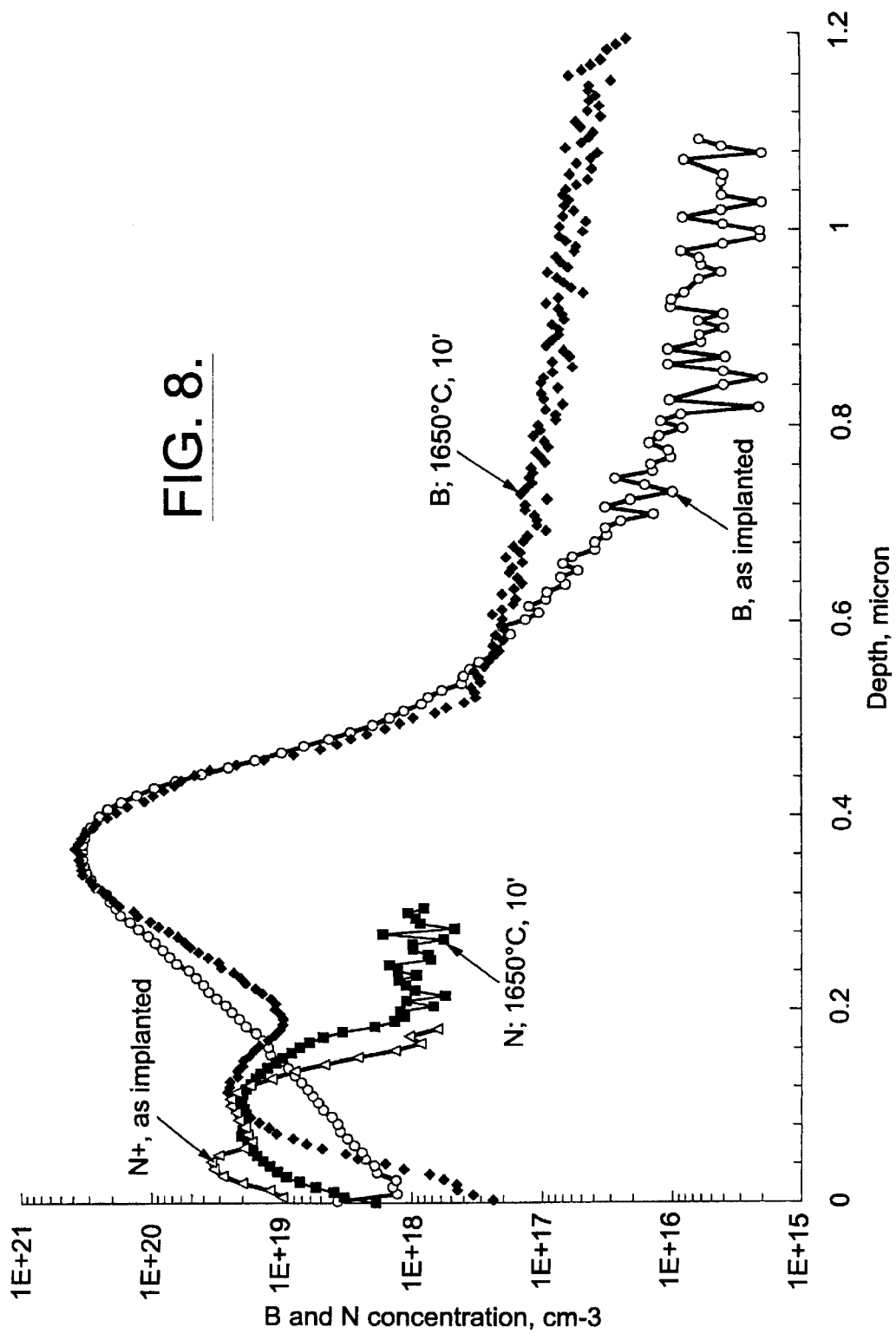
FIG. 8 graphically illustrates diffusion of nitrogen and boron during annealing.

Referring now to FIG. 8, diffusion of implanted boron and nitrogen during an anneal of ten minutes at 1650° C. is illustrated. In FIG. 8, boron is implanted at room temperature at energy of 180 keV and dosage of $4\times10^{15}$ cm$^{-2}$. Two nitrogen implants are performed at energies of 25 and 60 keV and dosages of $1.5\times10^{14}$ cm$^{-2}$ and $2.5\times10^{14}$ cm$^{-2}$ respectively. As shown in FIG. 8, very little nitrogen diffusion takes place during the ten minute anneal at 1650° C. However, a great deal of boron diffusion takes place during this anneal. It should be noted however, that although the boron diffuses deeper, away from the shallow nitrogen implant, the boron does not diffuse to the surface of the silicon carbide substrate through the shallow nitrogen implant.

Figure 9:
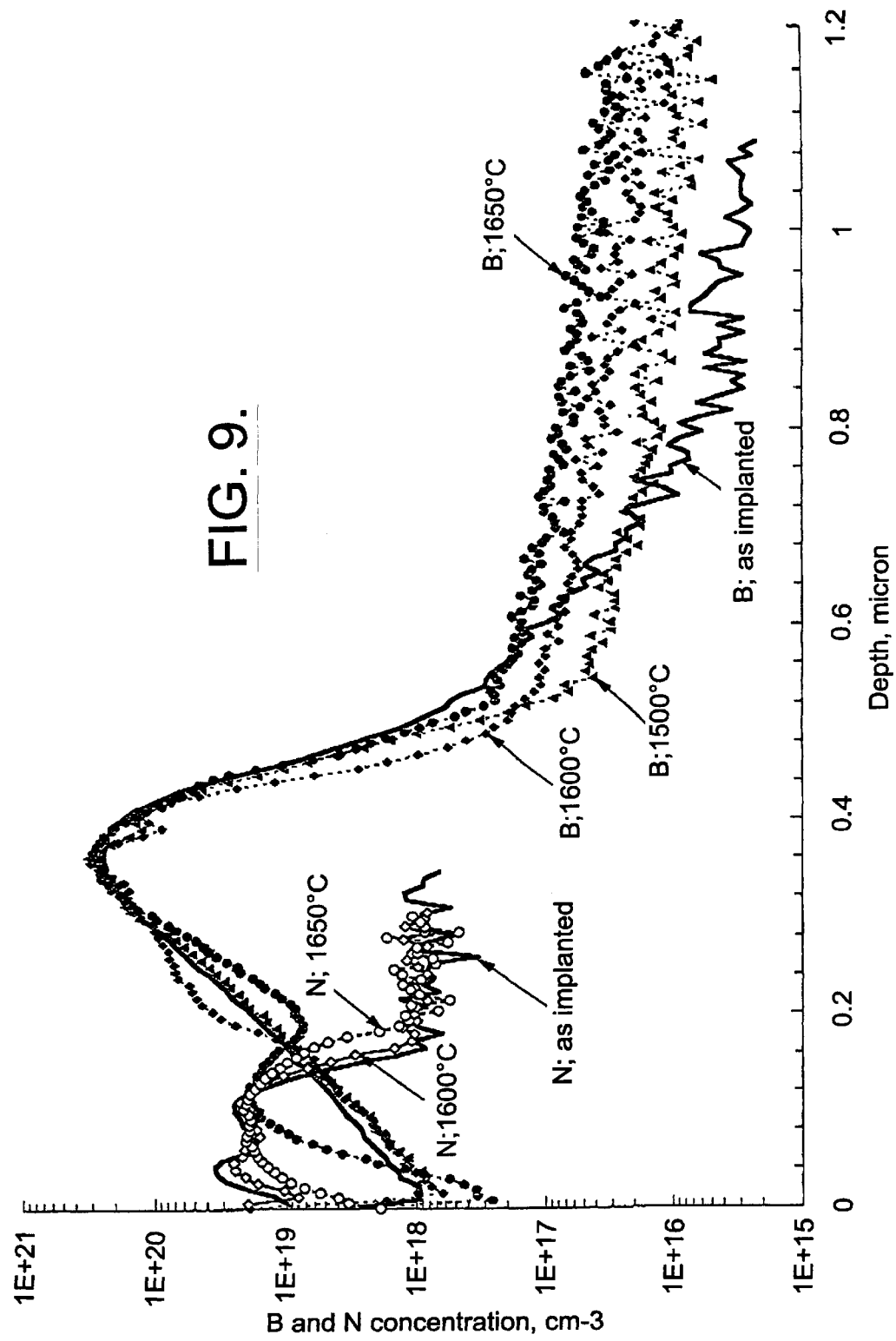
FIG. 9 graphically illustrates diffusion of nitrogen and boron during annealing at constant annealing time and variable annealing temperatures.

Referring now to FIG. 9, boron and nitrogen diffusion at constant annealing time and variable annealing temperature according to the present invention will now be described. Implantation conditions for boron and nitrogen are as was described in connection with FIG. 8.

As shown in FIG. 9, very little diffusion of nitrogen takes place at 1600° C. compared to the as implanted nitrogen. However, at 1650° C., nitrogen diffusion begins to take place. FIG. 9 also shows that very little diffusion of boron into the shallow nitrogen implant takes place at 1500° C. or at 1600° C. However, at 1650° C., significant boron diffusion occurs from the deep boron implant into the shallow nitrogen implant. Accordingly, annealing preferably takes place at less than 1650° C., but preferably at more than 1550° C. More preferably, annealing takes place at about 1600° C.

While not wishing to be bound by any theory of operation, it is theorized that at temperatures less than 1550° C., insignificant thermal energy is provided to allow diffusion of the deep p-type implant to the surface of the silicon carbide substrate surrounding the shallow n-type implant within reasonable times. In contrast, at temperatures above 1650° C., significant vertical diffusion of the deep p-type implant to the surface of the silicon carbide substrate through the shallow n-type implant takes place. This significant vertical diffusion can degrade the device performance and can also reduce the amount of boron that remains to laterally diffuse to the surface of the silicon carbide substrate surrounding the shallow nitrogen implant. Accordingly, annealing temperatures between 1550° C. and 1650° C. are preferred. This contrasts sharply from published PCT International Application WO 98/02916, where annealing times between 1650° C. and 1800° C. are used.

Figure 10:
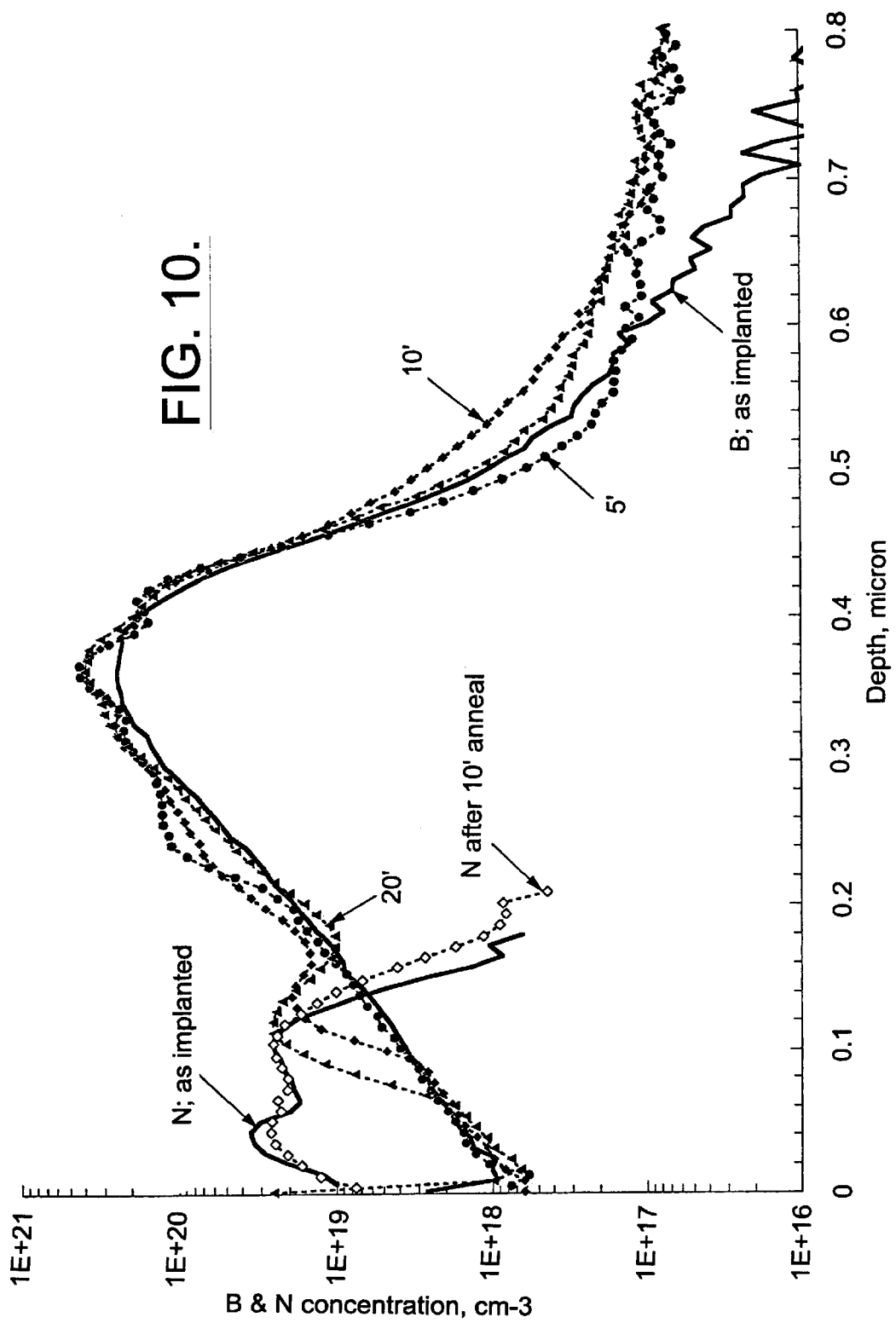
FIG. 10 graphically illustrates diffusion of nitrogen and boron during annealing at constant annealing temperature and variable annealing times.

Referring now to FIG. 10, it has also been found that the annealing time can also have a significant impact upon device performance. More specifically, FIG. 10 graphically illustrates diffusion of implanted boron and nitrogen during an anneal at 1600° C. and for times of five, ten and twenty minutes. The implantation conditions for FIG. 10 are the same as for FIG. 8.

As shown in FIG. 10, for an anneal at 1600° C. for five minutes, there is no diffusion of nitrogen and insignificant amounts of boron diffuse into the shallow nitrogen implant. For a ten minute anneal, although there is some vertical diffusion of nitrogen and some diffusion of boron into the shallow nitrogen implant, these amounts may not significantly degrade device performance. In contrast, at a twenty minute anneal, significant vertical diffusion of boron takes place into the shallow nitrogen implant. Accordingly, temperatures of between five and fifteen minutes are preferred, with a temperature of ten minutes being most preferred.

While not wishing to be bound by any theory of operation, it is theorized that for annealing times longer than fifteen minutes, significant diffusion of boron into the shallow nitrogen implant can take place even at low annealing temperatures. Moreover, for annealing times of less than five minutes, there may be insufficient diffusion of the boron from the deep p-type implant to form the p+ diffusion region that supplies the lateral diffusion to the substrate surface.

Figure 11:
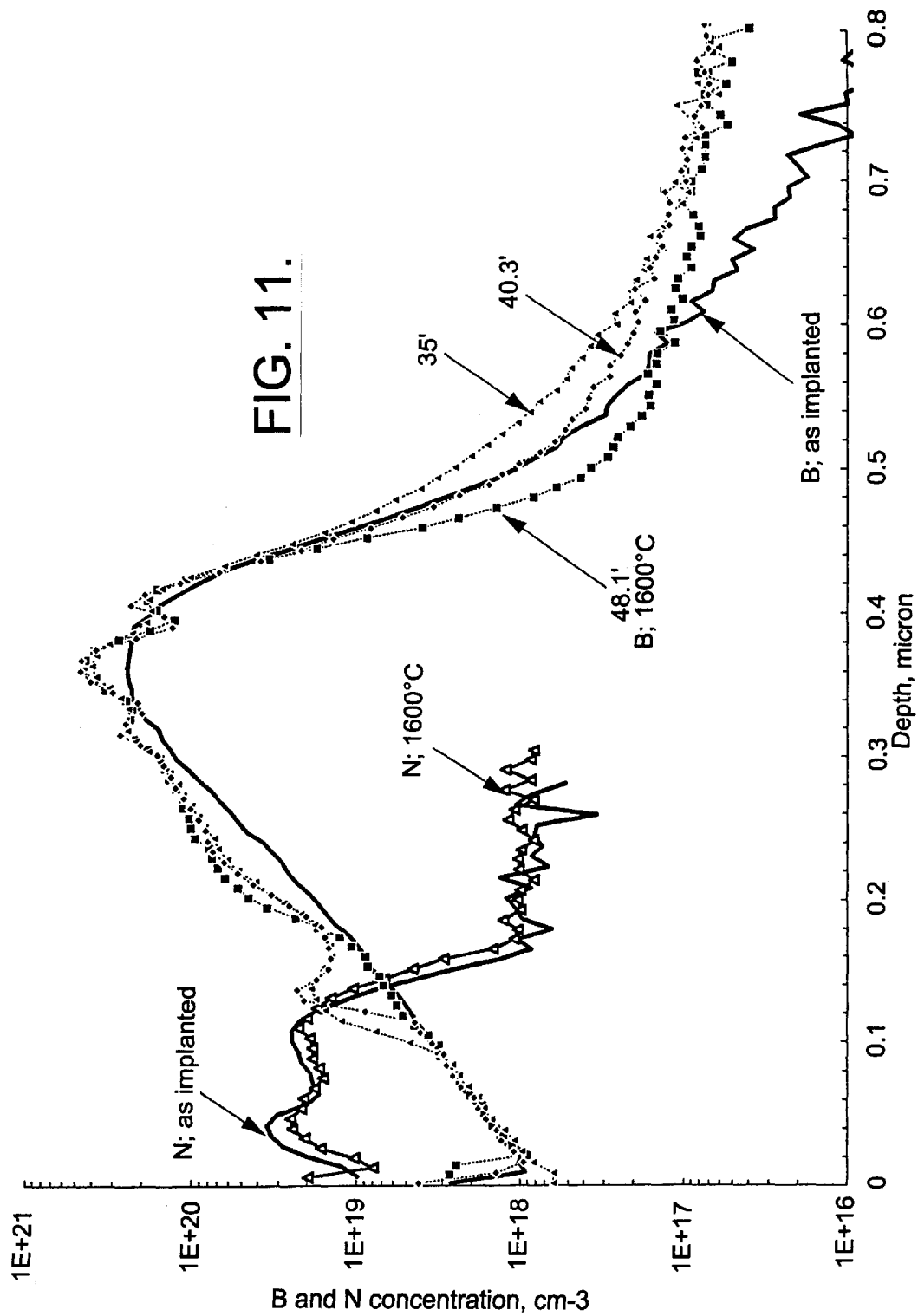
FIG. 11 graphically illustrates diffusion of nitrogen and boron during annealing at constant annealing temperature and time and at variable ramp-up times.

Referring now to FIG. 11, it has also been found that ramp-up time to the anneal temperature can have a significant impact on the diffusion of boron from the deep p-type implant into the shallow n-type implant. More specifically, FIG. 11 illustrates ramp-up times from room temperature to 1460° C. of 35 minutes, 40.3 minutes and 48.1 minutes and to 1600° C. of 41 minutes, 46 minutes and 55 minutes. The implantation conditions for FIG. 10 are the same as for FIG. 8. Annealing is performed for ten minutes at 1600° C.

As shown in FIG. 11, for ramp-up times of 55 minutes, very little diffusion from the deep boron implant into the shallow nitrogen implant takes place. In contrast, at ramp-up times of 46 minutes, significant diffusion of boron from the deep p-type implant into the shallow nitrogen implant takes place. At a ramp-up time of 41 minutes, even more diffusion takes place.

Accordingly, the temperature of the silicon carbide substrate is preferably increased from room temperature to the annealing temperature in less than one hundred minutes, but more than thirty minutes. While not wishing to be bound any theory of operation, it is theorized that for ramp-up times below thirty minutes, annealing of defects in the silicon carbide substrate take place, thereby allowing boron from the deep p-type implant to diffuse into the shallow n-type implant. In this regard, controlling the temperature between 500° C. and 1460° C. to between twenty and sixty minutes may be most critical, to prevent annealing of defects in the silicon carbide substrate. Below 500° C., little if any diffusion takes place. Between 1400° C. and the annealing temperature, the interval should preferably be controlled to between one and fifteen minutes.

Figure 12:
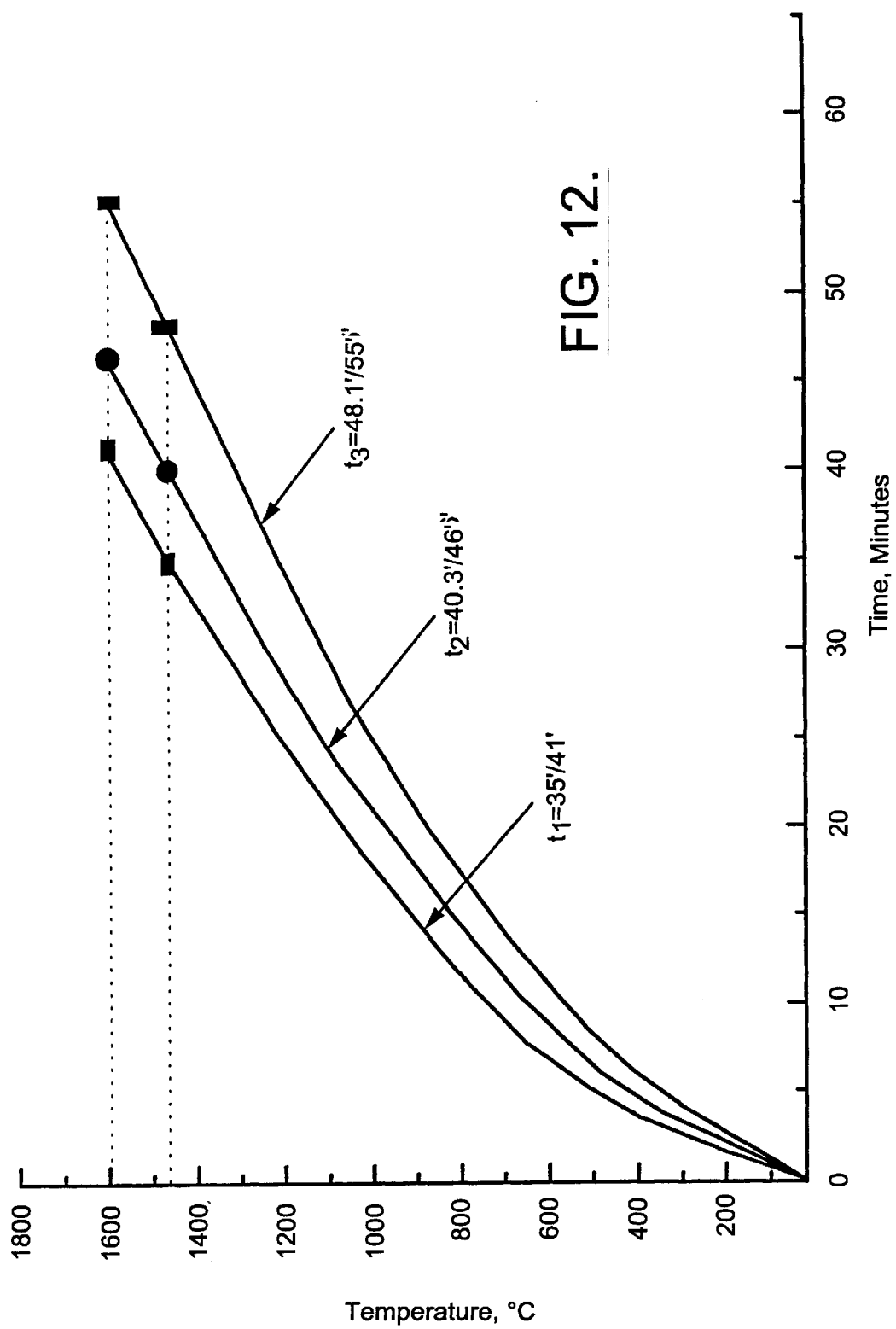
FIG. 12 graphically illustrates nonlinear ramp-up.

It will be understood that linear ramp-up may be used. Alternatively, nonlinear ramp-up may be used. FIG. 12 illustrates nonlinear ramp-up profiles for the ramp-up times of 35, 40.3 and 48.1 minutes of FIG. 11. Differing slopes from room temperature to 1460° C. and 1600° C. are provided. In a most preferred embodiment, a ramp-up time of fifty five minutes, an anneal temperature of 1600° C. and an anneal time of ten minutes is used.

It has also been found, according to the invention, that the temperature of the silicon carbide substrate should rapidly be decreased (ramped down) to below 1500° C., to prevent further diffusion after the annealing is completed. Preferably, the temperature of the silicon carbide substrate is decreased from the annealing temperature to below 1500° C. in less than two minutes. Thus, by controlling the ramp-up time, the annealing time and/or temperature and/or the ramp-down time, high performance silicon carbide power devices may be fabricated.

Accordingly, high performance silicon carbide power devices may be fabricated with self-aligned source and p-base regions and with a uniform p-channel. An inversion layer may be formed laterally across the surface of the substrate. A retrograde profile of the p-base may be obtained for a lower threshold voltage and a higher activation of the implanted n+ source. Since aluminum need not be used for the p-base region, a higher quality and/or thinner gate oxide region may be obtained, which can further lower the threshold voltage.

Moreover, high electric fields need not be present at the p-base, so that problems related to scattering or field concentration may be avoided. No sharp corners need be present in the n+ oxide, to thereby allow reduction in hot electron injection during on-state operation. High mobility in the channel may also be provided since the diffused channel can provide a reactive ion etch damage-free silicon carbide/ silicon dioxide interface that can provide low interface trap density and fixed charges.

Finally, simplified fabrication may be provided by eliminating at least one mask and providing self-alignment which reduces the need for tight alignment tolerances. Accordingly, improved methods of fabricating silicon carbide power devices may be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a silicon carbide power device comprising the steps of:
   masking a surface of a silicon carbide substrate to define an opening at the surface;
   implanting p-type dopants into the silicon carbide substrate through the opening at implantation energy and dosage that form a buried p-type implant;
   implanting n-type dopants into the silicon carbide substrate through the opening at implantation energy and dosage that form a surface n-type implant relative to the buried p-type implant;
   nonlinearly increasing the temperature of the silicon carbide substrate from room temperature to an annealing temperature of less that 1650° C. sufficiently rapidly to prevent annealing of defects in the silicon carbide substrate; and
   annealing the buried p-type implant and the surface n-type implant at less than 1650° C.

2. A method of fabricating a silicon carbide power device comprising the steps of:
   masking a surface of a silicon carbide substrate to define an opening at the surface;
   implanting p-type dopants into the silicon carbide substrate through the opening at implantation energy and dosage that form a buried p-type implant;
   implanting n-type dopants into the silicon carbide substrate through the opening at implantation energy and dosage that form a surface n-type implant relative to the buried p-type implant;
   annealing the buried p-type implant and the surface n-type implant at less than 1650° C.; and
   decreasing the temperature of the silicon carbide substrate to below about 1500° C.

3. A method of fabricating a silicon carbide power device comprising the steps of:
   masking a surface of a silicon carbide substrate to define an opening at the surface;
   implanting p-type dopants into the silicon carbide substrate through the opening at implantation energy and dosage that form a buried p-type implant;
   implanting n-type dopants into the silicon carbide substrate through the opening at implantation energy and dosage that form a surface n-type implant relative to the buried p-type implant;
   annealing the buried p-type implant and the surface n-type implant at less than 1650° C.; and
   decreasing the temperature of the silicon carbide substrate from the annealing temperature of less than 1650° C. to below about 1500° C. in less than about 2 minutes.

4. A method of fabricating a silicon carbide power device comprising the steps of:
   masking a surface of a silicon carbide substrate to define an opening at the surface;
   implanting p-type dopants into the silicon carbide substrate through the opening at implantation energy and dosage that form a buried p-type implant;
   implanting n-type dopants into the silicon carbide substrate through the opening at implantation energy and dosage that form a surface n-type implant relative to the buried p-type implant; and annealing the buried p-type implant and the surface n-type implant at less than 1650° C.;

wherein the step of implanting n-type dopants precedes the step of implanting p-type dopants; and wherein the following step is performed between the steps of implanting n-type dopants and implanting p-type dopants:

electrically activating the n-type dopants.

5. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant; and annealing the buried p-type implant and the surface n-type implant at less than 1650° C. for a time that is sufficient to laterally diffuse the buried p-type implant to the surface of the silicon carbide substrate surrounding the surface n-type implant;

the method further comprising the step of forming an aluminum well at the surface of the silicon carbide substrate, electrically contacting the laterally diffused p-type implant.

6. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

annealing the buried p-type implant and the surface n-type implant at less than 1650° C. for a time that is sufficient to laterally diffuse the buried p-type implant to the surface of the silicon carbide substrate surrounding the surface n-type implant;

forming an aluminum well at the source of the silicon carbide substrate, electrically contacting the laterally diffused p-type implant;

implanting n-type dopants into the surface of the silicon carbide substrate in spaced apart relation from the laterally diffused p-type implant to define a drain region;

forming a gate insulating region on the surface of the silicon carbide substrate, that contacts the laterally diffused p-type implant at the surface of the silicon carbide substrate; and forming a source contact, a drain contact and a gate contact on the surface n-type implant and on the aluminum well, on the drain region, and on the gate insulating region, respectively, to thereby form a lateral MOSFET.

7. A method according to claim 5 further comprising the steps of:

forming a gate insulating region on the surface of the silicon carbide substrate, that contacts the laterally diffused p-type implant at the surface of the silicon carbide substrate; and forming a source contact, a drain contact and a gate contact on the surface n-type implant and on the aluminum well, on a second surface of the silicon carbide substrate that is opposite to the source contact, and on the gate insulating region, respectively, to thereby form a vertical MOSFET.

8. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

annealing the buried p-type implant and the surface n-type implant at less than 1650° C. for a time that is sufficient to laterally diffuse the buried p-type implant to the surface of the silicon carbide substrate surrounding the surface n-type implant; and forming an aluminum well at the surface of the silicon carbide substrate, extending through the surface n-type implant and electrically contacting the laterally diffused p-type implant.

9. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

annealing the buried p-type implant and the surface n-type implant at less than 1650° C. for a time that is sufficient to laterally diffuse the buried p-type implant to the surface of the silicon carbide substrate surrounding the surface n-type implant; and forming an aluminum well at the surface of the silicon carbide substrate, outside of and electrically contacting the laterally diffused p-type implant.

10. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

increasing the temperature of the silicon carbide substrate from room temperature to a first temperature of less than 1650° C. in less than about 100 minutes but more than about 30 minutes; and then annealing the buried p-type implant and the surface n-type implant at the first temperature.

11. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

increasing the temperature of the silicon carbide substrate from room temperature to a first temperature of less than 1650° C. in less than about 100 minutes but more than about 30 minutes; including increasing the temperature of the silicon carbide substrate from below about 500° C. to about 1400° C. in less than about 60 minutes but more than about 20 minutes; and then annealing the buried p-type implant and the surface n-type implant at the first temperature.

12. A method according to claim 10 wherein the increasing step comprises a step of linearly or nonlinearly increasing the temperature of the silicon carbide substrate from room temperature to a temperature of less than 1650° C. in less than about 100 minutes but more than about 30 minutes.

13. A method according to claim 10 wherein the annealing step comprises a step of annealing the buried p-type implant and the surface n-type implant at less than 1650° C.

14. A method according to claim 13 wherein the annealing step comprises a step of annealing at more than about 1550° C. but less than 1650° C.

15. A method according to claim 14 wherein the annealing step further comprises a step of annealing at more than about 1550° C. but less than 1650° C. for between about 5 minutes and about 30 minutes.

16. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

increasing the temperature of the silicon carbide substrate from room temperature to a first temperature of less than 1650° C. in less than about 100 minutes but more than about 30 minutes;

annealing the buried p-type implant and the surface n-type implant at the first temperature; and then decreasing the temperature of the silicon carbide substrate to below about 1500° C.

17. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

increasing the temperature of the silicon carbide substrate from room temperature to a first temperature of less than 1650° C. in less than about 100 minutes but more than about 30 minutes;

annealing the buried p-type implant and the surface n-type implant at the first temperature; and then decreasing the temperature of the silicon carbide substrate from the annealing temperature of less than 1650° C. to below about 1500° C. in less than about 2 minutes.

18. A method according to claim 10 wherein the step of implanting p-type dopants precedes the step of implanting n-type dopants.

19. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

increasing the temperature of the silicon carbide substrate from room temperature to a first temperature of less than 1650° C. in less than about 100 minutes but more than about 30 minutes; and then annealing the buried p-type implant and the surface n-type implant at the first temperature;

wherein the step of implanting n-type dopants precedes the step of implanting p-type dopants; and wherein the following step is performed between the steps of implanting n-type dopants and implanting p-type dopants:

electrically activating the n-type dopants.

20. A method according to claim 10:

wherein the step of implanting p-type dopants comprises a step of implanting p-type dopants into the silicon carbide substrate through the opening at a plurality of implantation energies and dosages that form the buried p-type implant; and wherein the step of implanting n-type dopants comprises a step of implanting n-type dopants into the silicon carbide substrate through the opening at a plurality of implantation energies and dosages that form the surface n-type implant relative to the buried p-type implant.

21. A method according to claim 20:

wherein the step of implanting p-type dopants comprises a step of implanting boron into the silicon carbide substrate through the opening to form the buried p-type implant; and wherein the step of implanting n-type dopants comprises a step of implanting nitrogen into the silicon carbide substrate through the opening to form the surface n-type implant relative to the buried p-type implant.

22. A method according to claim 20:

wherein the step of implanting p-type dopants comprises a step of implanting beryllium into the silicon carbide substrate through the opening to form the buried p-type implant; and wherein the step of implanting n-type dopants comprises a step of implanting nitrogen into the silicon carbide substrate through the opening to form the surface n-type implant relative to the buried p-type implant.

23. A method according to claim 10 wherein the annealing comprises annealing the buried p-type implant and the surface n-type implant at less than 1650° C. for a time that is sufficient to laterally diffuse the buried p-type implant to the surface of the silicon carbide substrate surrounding the surface n-type implant;

the method further comprising a step of forming an aluminum well at the surface of the silicon carbide substrate, electrically contacting the laterally diffused p-type implant.

24. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

increasing the temperature of the silicon carbide substrate from room temperature to a first temperature of less than 1650° C. in less than about 100 minutes but more than about 30 minutes; and then annealing the buried p-type implant and the surface n-type implant at less than 1650° C. for a time that is sufficient to laterally diffuse the deep p-type implant to the surface of the silicon carbide substrate surrounding the shallow n-type implant;

forming an aluminum well at the surface of the silicon carbide substrate, electrically contacting the laterally diffused p-type implant;

implanting n-type dopants into the surface of the silicon carbide substrate in spaced apart relation from the laterally diffused p-type implant to define a drain region;

forming a gate insulating region on the surface of the silicon carbide substrate, that contacts the laterally diffused p-type implant at the surface of the silicon carbide substrate; and forming a source contact, a drain contact and a gate contact on the surface n-type implant and on the aluminum well, on the drain region, and on the gate insulating region, respectively, to thereby form a lateral MOSFET.

25. A method according to claim 23 further comprising the steps of:

forming a gate insulating region on the surface of the silicon carbide substrate, that contacts the laterally diffused p-type implant at the surface of the silicon carbide substrate; and forming a source contact, a drain contact and a gate contact on the surface n-type implant and on the aluminum well, on a second surface of the silicon carbide substrate that is opposite to the source contact, and on the gate insulating region, respectively, to thereby form a vertical MOSFET.

26. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

increasing the temperature of the silicon carbide substrate from room temperature to a first temperature of less than 1650° C. in less than about 100 minutes but more than about 30 minutes; and then annealing the buried type implant and the surface n-type implant at the first temperature for a time that is sufficient to laterally diffuse the buried p-type implant to the surface of the silicon carbide substrate surrounding the surface n-type implant; and forming an aluminum well at the surface of the silicon carbide substrate, extending through the surface n-type implant and electrically contacting the laterally diffused p-type implant.

27. A method of fabricating a silicon carbide power device comprising the steps of:

masking a surface of a silicon carbide substrate to define an opening at the surface;

implanting p-type dopants into the silicon carbide substrate through the opening at implantation energy and dosage that form a buried p-type implant;

implanting n-type dopants into the silicon carbide substrate through the opening at implantation energy and dosage that form a surface n-type implant relative to the buried p-type implant;

increasing the temperature of the silicon carbide substrate from room temperature to a first temperature of less than 1650° C. in less than about 100 minutes but more than about 30 minutes; and then annealing the buried p-type implant and the surface n-type implant at the first temperature for a time that is sufficient to laterally diffuse the buried p-type implant to the surface of the silicon carbide substrate surrounding the surface n-type implant; and forming an aluminum well at the surface of the silicon carbide substrate, outside of and electrically contacting the laterally diffused p-type implant.

* * * * *

UNITED STATES PATENT AND TRADEMARK OFFICE
CERTIFICATE OF CORRECTION

PATENT NO. : 6,303,475 B1 Page 1 of 1
DATED : October 16, 2001
INVENTOR(S) : Suvorov et al.

It is certified that error appears in the above-identified patent and that said Letters Patent is hereby corrected as shown below:

Column 13,
Line 49, please change "source" to -- surface --.

Signed and Sealed this

Thirteenth Day of July, 2004

JON W. DUDAS
*Acting Director of the United States Patent and Trademark Office*